(12) United States Patent
Bocco et al.

(10) Patent No.: US 11,461,095 B2
(45) Date of Patent: Oct. 4, 2022

(54) METHOD AND DEVICE FOR FLOATING POINT REPRESENTATION WITH VARIABLE PRECISION

(71) Applicants: Commissariat à l'Energie Atomique et aux Energies Alternatives, Paris (FR); Institut National des Sciences Appliquées de Lyon, Villeurbanne (FR)

(72) Inventors: Andrea Bocco, Grenoble (FR); Florent Dupont De Dinechin, Villeurbanne (FR); Yves Durand, Grenoble (FR)

(73) Assignees: Commissariat à l'Energie Atomique et aux Energies Alternatives, Paris (FR); Institut National des Sciences Appliquées de Lyon, Villeurbanne (FR)

( * ) Notice: Subject to any disclaimer, the term of this patent is extended or adjusted under 35 U.S.C. 154(b) by 0 days.

(21) Appl. No.: 16/811,641

(22) Filed: Mar. 6, 2020

(65) Prior Publication Data

US 2020/0285468 A1    Sep. 10, 2020

(30) Foreign Application Priority Data

Mar. 8, 2019 (FR) ...................... 1902386

(51) Int. Cl.
   *G06F 9/30*     (2018.01)
   *G06F 7/483*    (2006.01)
   *G06F 7/499*    (2006.01)

(52) U.S. Cl.
   CPC .......... *G06F 9/30014* (2013.01); *G06F 7/483* (2013.01); *G06F 7/49915* (2013.01); *G06F 9/30112* (2013.01)

(58) Field of Classification Search
   CPC .. G06F 9/30014; G06F 7/483; G06F 7/49915; G06F 9/30112; G06F 2207/3816;
   (Continued)

(56) References Cited

U.S. PATENT DOCUMENTS 6,496,920 B1   12/2002   Zou et al.
8,412,760 B2 *  4/2013   Hickey ................ G06F 7/5443
                                                      708/513

(Continued)

FOREIGN PATENT DOCUMENTS

CN         107766078 A      3/2018
NO       2017070710 A1      4/2017

OTHER PUBLICATIONS

Brent et al.; Modern Computer Arithmetic—Version 0.5.9 of Oct. 7, 2010; 2010 (Year: 2010).*

(Continued)

*Primary Examiner* — Corey S Faherty
(74) *Attorney, Agent, or Firm* — Moreno IP Law LLC

(57) ABSTRACT

The present disclosure relates to a method of storing, by a load and store circuit or other processing means, a variable precision floating point value to a memory address of a memory, the method comprising: reducing the bit length of the variable precision floating point value to no more than a size limit, and storing the variable precision floating point value to one of a plurality of storage zones in the memory, each of the plurality of storage zones having a storage space equal to or greater than the size limit (MBB).

20 Claims, 9 Drawing Sheets

(58) Field of Classification Search
CPC ..... G06F 2212/1024; G06F 2212/1044; G06F 12/04; H03M 7/24
See application file for complete search history.

(56) References Cited

U.S. PATENT DOCUMENTS

| | | | |
|---|---|---|---|
| 9,886,239 B2* | 2/2018 | Larri | G06F 9/30192 |
| 10,200,060 B1 | 2/2019 | Ciarlini et al. | |
| 11,006,138 B2* | 5/2021 | Surti | H04N 19/85 |
| 2011/0004644 A1* | 1/2011 | Henry | G06F 9/30014 |
| | | | 708/231 |
| 2018/0074950 A1 | 3/2018 | Bradbury et al. | |

OTHER PUBLICATIONS

R.P. Brent et al., "Modem Computer Arithmetic (version 0.5.1)," ARXIV.org, Cornell University Library, 201 Olin Library, Cornell University, Ithaca, NY 14853, Apr. 27, 2010, 263 pages.

Preliminary Search Report for French Application No. 1902386 dated Jan. 9, 2020, 2 pages.

Schulte, M.J. et al., "A Family of Variable-Precision Interval Arithmetic Processors," IEEE Transactions on Computers, vol. 49, No. 5, May 2000, 11 pages.

Kirchner R. et al., "Arithmetic for vector processors," 1987 IEEE 8th Symposium on Computer Arithmetic, May 1987, 14 pages.

Gustafson, J.L., "The End of Error: Unum Computing," CRC Press, 2015, 425 pages.

\* cited by examiner

METHOD AND DEVICE FOR FLOATING POINT REPRESENTATION WITH VARIABLE PRECISION

FIELD

The present disclosure relates generally to the field of floating point computations, and in particular to a method and device for variable precision computing.

BACKGROUND

The IEEE 754-2008 standard defines a Floating Point (FP) format according to which numbers are represented using a fixed number of bits, most commonly 16, 32, 64 or 128 bits, although non-binary numbers and numbers larger than 128 bits are also supported.

A drawback of the IEEE 754-2008 FP representation is that, due to the discrete nature of the bit lengths, computations based on FP numbers can be affected by computational errors such as rounding errors, cancellation errors and absorption errors.

Cancellation errors occur when a FP number having a very large value is subtracted from another FP number have a very large value, the two FP numbers being relatively close in value to each other, but not equal. In view of the precision associated with these large FP numbers, the subtraction outputs zero.

Absorption errors occur when a FP number having a very small value is added or subtracted with/from a FP number having a very large value, and in view of the precision associated with the very large FP number, the addition or subtraction does not result in any modification of the large FP number.

The accumulation of rounding, cancellation and absorption errors can quickly lead to very significant inaccuracies in the computation.

Variable precision computing, also known in the art as multiple precision, trans precision and controlled precision computing, provides a means for obtaining improvements in terms of precision where needed, thereby reducing computational errors. Variable precision computing is particularly relevant for solving problems that are not very stable numerically, or when particularly high precision is desired at some points of the computation.

However, there are technical problems with existing variable precision computing solutions, at least in terms of the memory footprint. There is thus a need in the art for an improved method and device for performing variable precision computing.

SUMMARY

It is an aim of embodiments of the present disclosure to address one or more needs in the prior art.

According to one embodiment, there is provided a method of storing, by a load and store circuit or other processing means, a variable precision floating point value to a memory address of a memory, the method comprising: reducing the bit length of the variable precision floating point value to no more than a size limit; and storing the variable precision floating point value to one of a plurality of storage zones in the memory, each of the plurality of storage zones having a storage space equal to or greater than the size limit. For example, the storage space of each of the plurality of storage zones is of the same size.

In some embodiments, the bit length is reduced by either: determining, by comparing a bit length of the variable precision floating point value with the size limit, that the bit length of the variable precision floating point value exceeds the size limit, and then rounding or truncating the variable precision floating point value; or converting the variable precision floating point value from a first format to a second format, wherein in the second format the bit length is limited to no more than the size limit.

According to one embodiment, the size limit is stored in a register accessible by the load and store circuit or other processing means, the size limit being programmable.

According to one embodiment, the method further comprises, before reducing the bit length, receiving by the load and store circuit or other processing means a load instruction comprising one or more bits indicating the size limit.

According to one embodiment, the size limit is equal to a multiple of p bits, where p is a positive integer, the size limit not being equal to a power of 2.

According to one embodiment, the method comprises the step of comparing the bit length of the variable precision floating point value with the size limit, and prior to the comparison, converting the variable precision floating point value from a third variable precision floating point format to the second variable precision floating point format.

According to one embodiment, the variable precision floating point value comprises an exponent field, a mantissa field, and at least one size field indicating an absolute or relative bit length of the exponent field and/or mantissa field.

According to one embodiment, reducing the bit length of the variable precision floating point value to no more than the size limit comprises modifying the at least one size field in view of the reduced bit length of the variable precision floating point value.

According to one embodiment, the at least one size field includes an exponent size field and a mantissa size field.

According to one embodiment, if a bit length of the at least one size field is capable of indicating a bit length of the exponent field and/or of the mantissa field that would exceed the size limit, the step of reducing the bit length comprises setting the at least one size field to a maximum value to encode at least one special FP value type.

According to one embodiment, each storage zone comprises a plurality of sub-portions, wherein storing the variable precision floating point value comprises storing the at least one size field of the variable precision floating point value to one or more first sub-portions of the storage zone.

According to a further aspect, there is provided a method of reading, from a memory address in a memory, a variable precision floating point value stored according to the above method, comprising: reading the one or more first sub-portions; identifying, based on the at least one size field, one or more further non-empty sub-portions of the storage zone; and reading the one or more further non-empty sub-portions of the storage zone.

According to one embodiment, identifying the one or more further non-empty sub-portions further comprises identifying at least one further empty sub-portion of the storage zone, the at least one empty further sub-portion not being read.

According to a further aspect, there is provided a method of reading, from a memory address in a memory, one or more variable precision floating point values stored according to the above method, comprising: reading bit values from one or more storage zones of the memory; and extracting from the read bit values one or more variable precision floating point values identified based on the at least one size field of each value.

According to a further aspect, there is provided a method of solving a scientific problem using at least one variable precision floating point processor, the method comprising: generating at least one intermediate result represented by an M-bit variable precision floating point value; and storing the M-bit variable precision floating point value to a memory according to the above method.

According to a further aspect, there is provided a computing system comprising a variable precision floating point processor configured to generate variable precision floating point values, the VP FP processor, and/or a load and store circuit coupled to the VP FP processor, being configured to store a variable precision floating point value to a memory by: reducing the bit length of the variable precision floating point value to no more than a size limit; and storing the variable precision floating point value to one of a plurality of storage zones in the memory, each of the plurality of storage zones having a storage space equal to or greater than the size limit.

According to one embodiment, the VP FP processor, and/or the load and store circuit coupled to the VP FP processor, is configured to reduce the bit length of the variable precision floating point value by either: determining, by comparing a bit length of the variable precision floating point value with the size limit, that the bit length of the variable precision floating point value exceeds the size limit, and then rounding or truncating the variable precision floating point value; or converting the variable precision floating point value from a first format to a second format, wherein in the second format the bit length is limited to no more than the size limit.

According to one embodiment, the computing system further comprises a register storing an indication of the size limit, the register being accessible and programmable by the variable precision floating point processor and/or by the load and store circuit.

According to one embodiment, the VP FP processor, and/or a load and store circuit coupled to the VP FP processor, is configured to store the variable precision floating point value to the memory based on a store instruction, wherein the store instruction comprises one or more bits indicating the size limit.

According to one embodiment, the VP FP processor is implemented: as part of a graphics processing unit; or as part of a floating point unit; or as part of a main processing device coupled to a floating point unit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

Unless specified otherwise, the expressions "around", "approximately", "substantially" and "in the order of" signify within 10%, and preferably within 5%.

In the following specification, the following terms will be considered to have the following meanings:
floating point (FP) number or value: a number expressed in the form of an exponent e and a mantissa or fraction f;
a FP format: a defined set of fields in a defined order used to represent a FP number, and having at least one field representing the exponent e, and another field representing the mantissa or fraction f;
self-descriptive variable precision (VP) FP format: any floating point number format having an exponent field, a mantissa field, and at least one size field indicating the size of the exponent field and/or mantissa field. For example, the size field comprises bits that are used to express either the length of the exponent field, the length of the mantissa field, a bit ratio between the exponent and mantissa fields, or a combined length of the exponent and mantissa fields or of the whole FP number. The VP FP format described herein optionally comprises a sign bit, an uncertainty bit and both an exponent size field indicating the size of the exponent and a mantissa size field indicating the size of the mantissa; bounded memory format: a self-descriptive VP FP format as defined above, and for which no value exceeds a maximum bit length defined by a maximum boundary budget or maximum byte budget (MBB), described in more detail below; and
special FP value type: any undefined or non-representable value, examples being values that are not numbers (NaN), that are at almost positive or negative infinity, or that define intervals bounded by almost positive or negative infinity.

Figure 1:
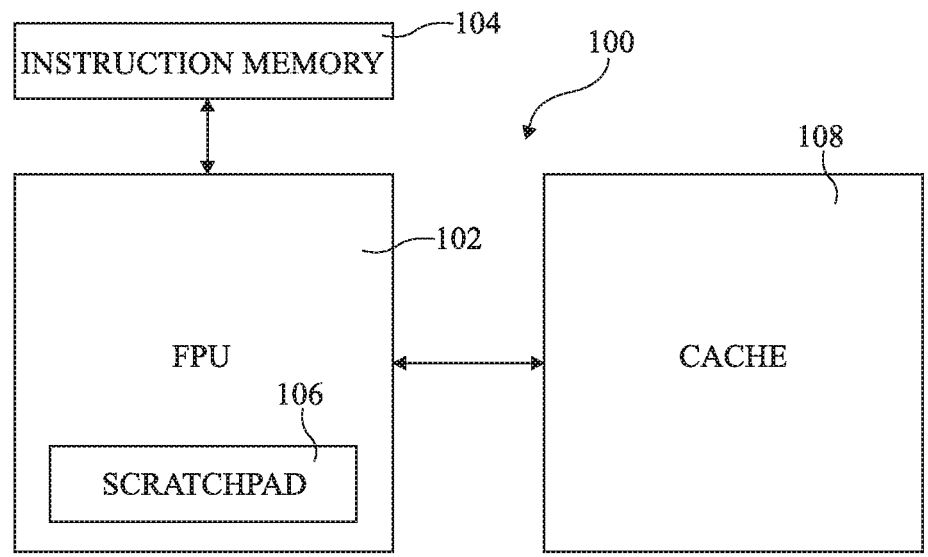
FIG. 1 schematically illustrates a variable precision computing system according to an example embodiment.

FIG. 1 schematically illustrates a variable precision computing system 100 comprising a floating point unit (FPU) 102 comprising one or more processors under control of instructions stored in an instruction memory (INSTRUCTION MEMORY) 104. The FPU 102 for example comprises a scratchpad (SCRATCHPAD) 106, and is coupled to a further memory 108, which is for example a cache (CACHE) memory.

The scratchpad 106 is for example a memory storing relatively precise variable precision FP numbers, for example of up to 256 bits each. This memory 106 is for example implemented by registers, by a relatively small memory array, or by any other type of memory having relatively fast access times. The cache memory 108 is for example a larger memory than the scratchpad 106, but has longer access times than the scratchpad 106.

Figure 2:
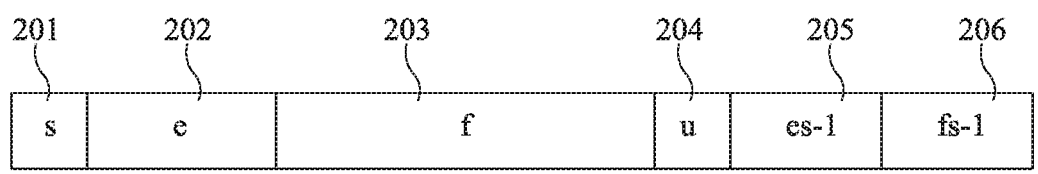
FIG. 2 represents the UNUM variable precision floating point number format.

FIG. 2 represents a VP FP number format known in the art as the Universal NUMber (UNUM) format.

The UNUM format comprises six fields labelled 201 to 206 in FIG. 2. The field 201 contains a value s indicating the sign of the number, for example using a single bit, the field 202 contains an exponent e of number, the field 203 contains a fraction or mantissa f of the number, the field 204 contains an uncertainty bit u, or ubit, associated with the number, the field 205 contains an exponent size es-1, and the field 206 contains a fraction or mantissa size fs-1. Thus, the UNUM format is a self-descriptive format in that information concerning the number of bits forming the exponent and the number of bits forming the mantissa, as defined by the fields 205 and 206, is dynamic and contained within the VP FP value, unlike in the format defined by the standard IEEE 754. These sizes can for example be customized based on the requirements of an application and/or user.

When expressed in bits, a value in the UNUM format can be decoded according to the following equation:

$$x = (-1)^s 2^{e-(2^{es-1}-1)+(1-Boole[e>0])} \cdot \left(Boole[e>0] + \frac{f}{2^{fs}}\right) \quad [1]$$

where s is the sign bit, e is the exponent, es is the size of the exponent in bits, f is the mantissa, fs is the size of the mantissa in bits, and Boole[e>0] is a Boolean function of the form Boole[test] that returns 1 when the test is true, and 0 otherwise. The fraction $f/(2^{fs})$ is for example in the range [0,1), in other words greater than or equal to zero and less than 1.

The UNUM format provides a variable precision representation having advantages for a variety of types of scientific calculation, examples of which will now be described with reference to FIGS. 3 and 4.

Figure 3:
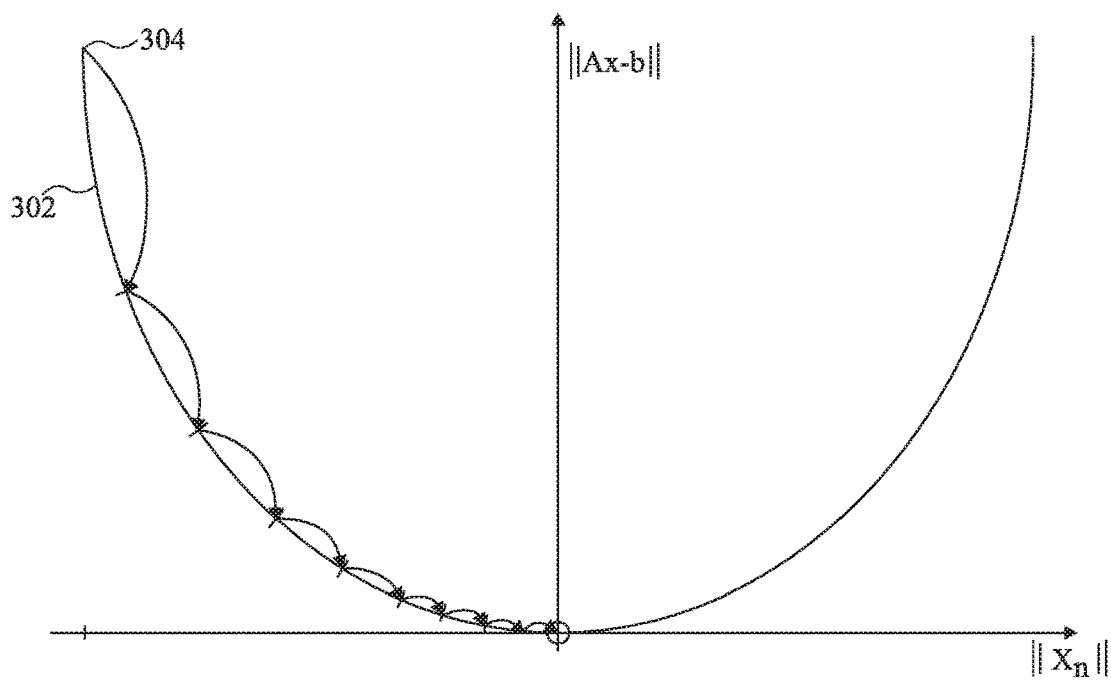
FIG. 3 is a graph representing an iterative approach to solving a scientific problem.

FIG. 3 is a graph representing an iterative approach to solving a scientific problem. For example, it is desired to find x that solves the relation Ax=b, where x is a vector of n elements of values $x_1$ to $x_n$, b is a vector of n elements of values $b_1$ to $b_n$, and A is an n by n matrix providing the input data. In one example, n is relatively large, for example equal to 500,000 or more, implying around a million or more degrees of freedom (DoF). The y-axis in FIG. 3 for example represents:

$$\|Ax-b\| \quad [2]$$

and the x-axis for example presents:

$$\|x_n\| \quad [3]$$

A curve 302 in FIG. 3 represents the convergence of the iterative approach, which reaches zero when x is such that Ax=b.

Variable precision computing is particularly beneficial for the type of iteration calculation represented in FIG. 3. Indeed, the iterative approach represented in FIG. 3 involves starting at a point on the curve 302, such as the one labelled 304, associated with a relatively high value of x. The value of Ax-b at this starting point for example has a relatively high magnitude, and should therefore be represented using a relatively long exponent, whereas the fraction is of less importance. The values of x are then modified in order to move along the curve 302, and as the solution converges towards a final value of x, the value of Ax-b will become smaller and smaller until reaching zero at the given precision of the corresponding VP FP value. For reasonable precision, these values close to convergence should be represented using a relatively long fraction, whereas the exponent of these values can be low. Thus it would be beneficial to represent values for such an iterative approach with variable precision, in other words in which the number of bits representing the exponent and fraction can change during the course of the computation, from a relatively big exponent and small fraction at the start of the algorithm to a relatively small exponent and big fraction towards the end of the algorithm.

Figure 4:
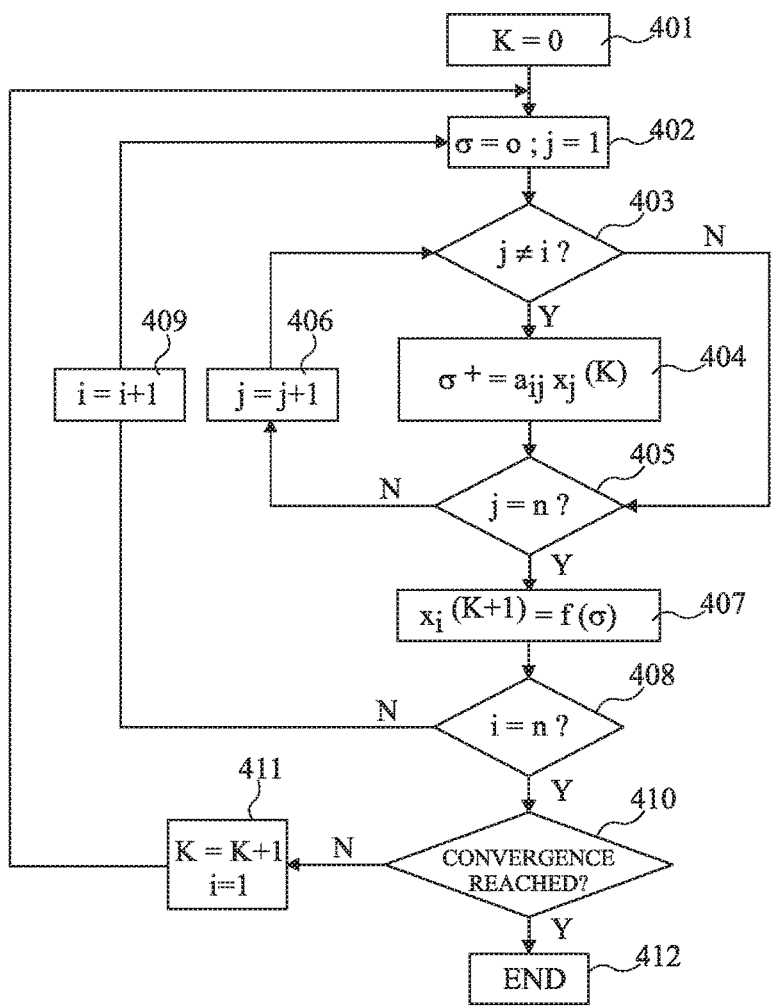
FIG. 4 is a flow diagram showing an example of an iterative approach for converging to a solution to a scientific problem.

FIG. 4 is a flow diagram showing an example of an iterative method for converging to a solution to a scientific problem, this method for example leading to the curve 302 of FIG. 3. In particular, the example of FIG. 4 is based on a simplified Jacobi solver that uses several nested loops.

In an operation 401, an iteration value K is for example set to zero.

In an operation 402 after operation 401, a variable σ is for example set to zero, and a variable j is for example set to 1.

In an operation 403 after operation 402, it is determined whether the variables j and i are not equal. If they are not equal, an operation 404 is performed, in which the variable σ is incremented by an increment equal to $a_{ij} \cdot x_j(K)$, where $a_{ij}$ is a value in the input matrix A at column i and row j, and $x_j$ is the jth value in the vector x.

After operation 404, or after the operation 403 if the variables i and j are equal, an operation 405 is performed in which it is determined whether j is equal to n, in other words whether the last row of the input matrix A has been reached. If not, j is incremented in an operation 406, and then the operation 403 is repeated. If, however, j is equal to n, the next operation is 407.

In operation 407, a value $x_i$ for the iteration K+1 is calculated as a function of the value of current value of σ, i.e. $x_i^{(K+1)} = f(σ)$.

After operation 407, in an operation 408, it is determined whether the variable i is equal to n, in other words whether the last column of the input matrix A has been reached. If not, i is incremented in an operation 409, and then the operations 402 to 407 are repeated.

If in operation 408 the variable i is equal to n, then in an operation 410, it is determined whether or not convergence has been reached, based for example on a calculation of the norm of the residue. If not, in an operation 411, the variable K is incremented and the variable i is reset to 1, and the method then returns to operation 402. Once it is determined in operation 410 that convergence has been reached, the method for example ends at an operation 412.

According to some embodiments, the accumulated values of the variable a during the inner loop formed of the operations 403 to 406 of FIG. 4 are stored in a scratchpad. However, the values of $x_i$ for example occupy a relatively large amount of memory, and are thus for example stored to cache.

Figure 5:
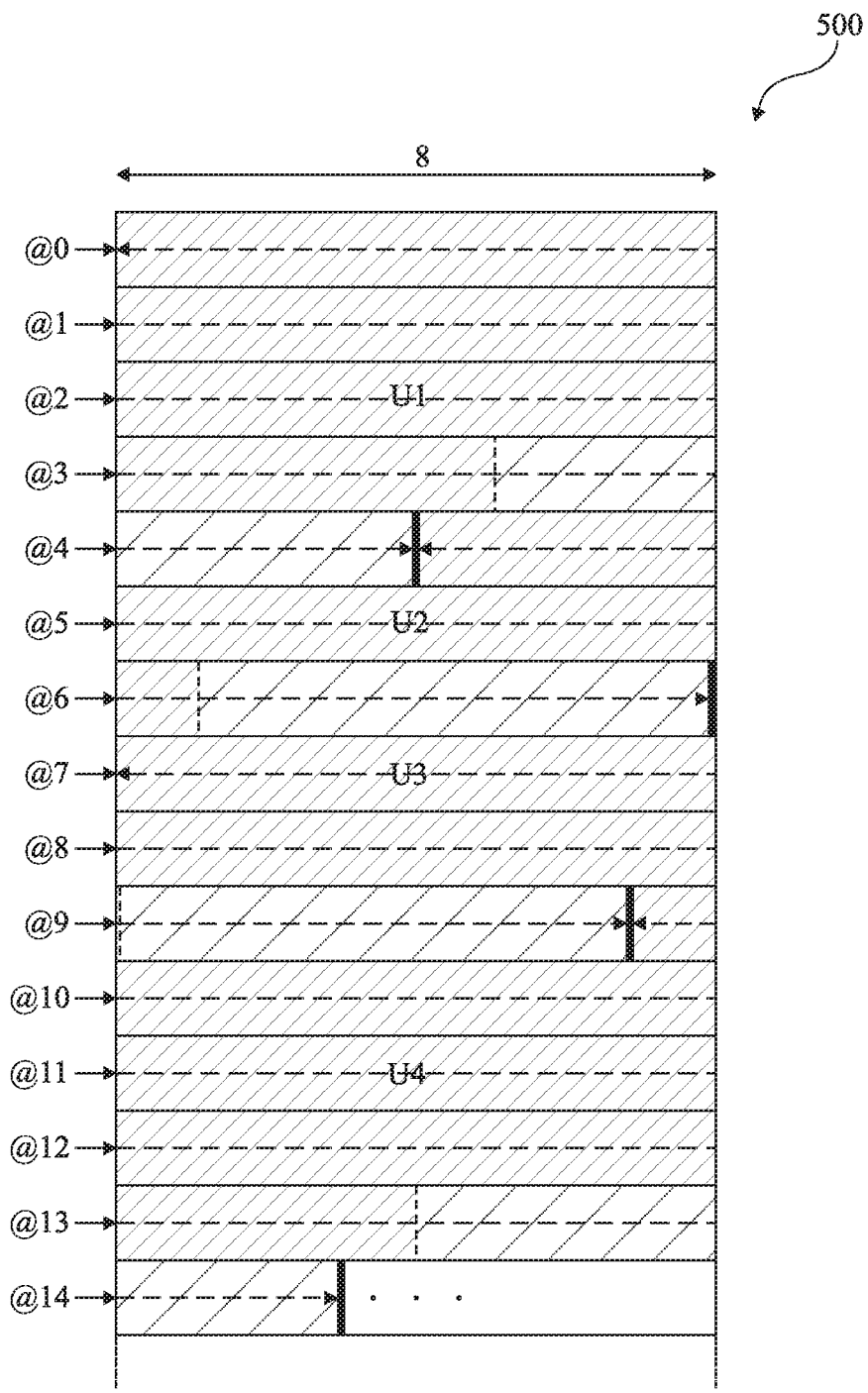
FIG. 5 represents memory addresses of a memory storing floating point numbers wherein each number has a variable memory footprint.

FIG. 5 represents memory addresses of a memory 500 storing floating point numbers in a self-descriptive variable precision format such as the UNUM format described above in relation with FIG. 2. For example, the values stored in the memory 500 correspond to any intermediate data that is too big to be maintained in the scratchpad and is thus stored to main memory. For example, in the particular case of FIG. 4, such intermediate data could correspond to the values of $x_1$ generated in the operation 407. In view of the variable precision format and thus the variable bit length of the values, the values stored in the memory have a variable memory footprint. The values are for example represented by numbers U1, U2, etc., in the UNUM format having a sign bit, exponent and fraction represented by densely shaded portions in FIG. 5, and the parameters u, es-1 and fs-1 represented by lightly shaded portions in FIG. 5. The length of each UNUM value in the memory is represented by a dashed arrow. Addresses @0 to @14 are represented in FIG. 5, the addresses having an address step of a byte of eight bits.

The UMUM values are of variable length, and all are over one byte. The values are stored in the memory one after the other with no empty space between adjacent values. This has advantages in terms of memory use efficiency. However, affine accesses to random positions in the memory array are difficult. An affine memory access implies that the address to be accessed is predictable, in other words that the address of a given value s[n] can be determined by a linear function of n, of the form α·n+β. For example, to access the value U4 in FIG. 5, the addresses @9 to @14 should be read, but this address information can only be obtained by first reading each of the values U1 to U3 in order to find out the bit lengths of each of these values. This places a significant constraint on any such read operation.

The capability of performing affine memory accesses is important in many applications. For example, with reference to the iterative method of FIG. 4, accessing the values xj in the operation 404, or updating the values $x_1$ in operation 407, involve affine memory accesses.

A further difficulty with the storage of FP values using variable footprints as represented in FIG. 5 is that overwriting a value with a new value of larger bit length becomes onerous. For example, to update the value U2 with a value having a larger bit length, the values U3 and U4, and any subsequent values in the memory, would also have to be rewritten.

Figure 6:
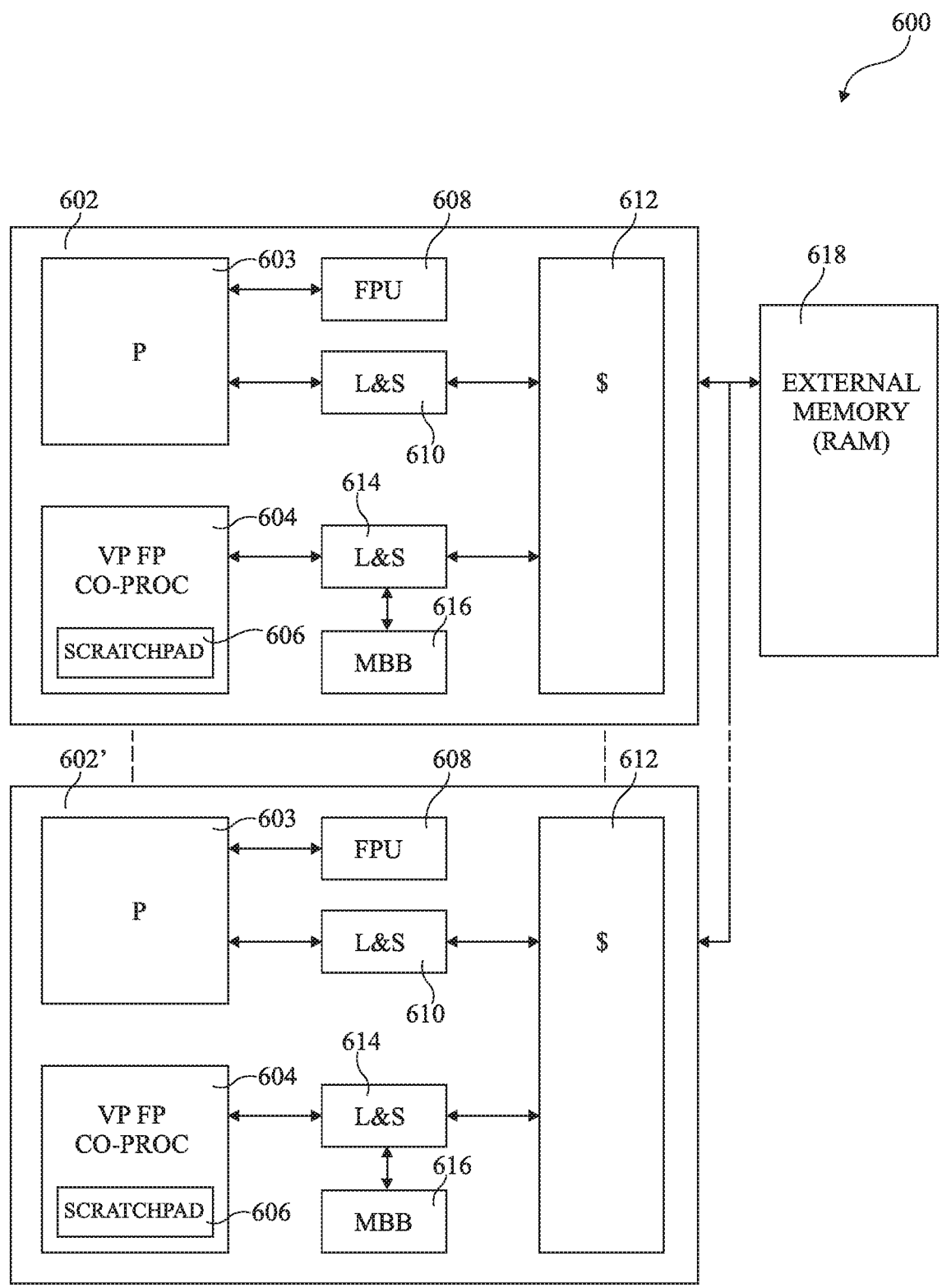
FIG. 6 schematically illustrates a variable precision computing system according to example embodiment of the present disclosure.

FIG. 6 schematically illustrates a variable precision computing system 600 according to example embodiment of the present disclosure.

The system 600 for example comprises a plurality of tiles, two tiles 602 and 602' being represented in FIG. 6, although there could be many more. Each tile in FIG. 6 corresponds to a processing module that can be assigned computational tasks in relation with a complex calculation, which may for example involve the use of a single tile, or of two or more tiles operating in parallel.

Each tile 602, 602' for example comprises a main processor (P) 603 and a variable precision floating point co-processor (VP FP CO-PROC) 604, which are for example coupled together. The VP FP co-processor 604 for example comprises a scratchpad (SCRATCHPAD) 606. In some embodiments the scratchpad 606 is implemented, for example, by 16, 32, 64 or more registers each storing a FP value having a mantissa of, for example, up to 512 bits in length or more. The scratchpad 606 for example has relatively fast access times. For example, in some embodiments, memory accesses to the scratchpad involve up to ten clock cycles of the co-processor 604.

In some embodiments, each tile 602, 602' comprises a floating point unit (FPU) 608 coupled to the main processor 603 permitting for example floating point computations based on standard FP values respecting the IEEE 754 FP format. For example, in some embodiments, the FPU 608 is used for computations that do not require high levels of precision, the execution of such computations being relatively energy and power efficient when performed by the FPU 608.

The main processor 603 of each tile 602, 602' is for example coupled to a load and store (L&S) circuit 610, which loads values from one or more cache memories ($) 612 and stores values to the one or more cache memories 612. The one or more cache memories 612 for example corresponds to level L1 cache local to each tile. Additionally or alternatively, the cache 612 may correspond to a cache memory that is shared by a cluster of two or more tiles, such as L2 cache, L3 cache, and/or a lower level cache up to the LLC (last level cache), which is the last cache before leaving the chip.

The VP FP co-processor 604 of each tile is for example also coupled to a load and store (L&S) circuit 614, which is in turn coupled to the one or more cache memories 612. The circuit 614 is also for example coupled to a system register 616 storing a value MBB indicating a maximum boundary budget or maximum byte budget, as will be described in more detail below.

While in FIG. 6 each tile 602, 602' comprises a main processor 603 and the VP FP processor 604 implemented as a co-processor, in alternative embodiments the functionalities of the VP FP processor 604, as well as the functionalities of the circuits 614 and 616, could be implemented as a GPU (graphics processing unit), as a GPGPU (general purpose computation implemented by a GPU), inside the FPU 608, inside the main processor 603 and/or inside the circuit 610. Furthermore, the circuits 608 and 610 could be implemented within the main processor 603.

Furthermore, in alternative embodiments, the load and store circuit 614 and register 616 could be implemented within the VP FP co-processor 604 in hardware and/or at least partially emulated by software or firmware executed by the co-processor 604. Furthermore, in some embodiments, the register 616 could be omitted, and the value MBB provided to the load and store circuit 614 in a store instruction, generated for example by the co-processor 604. For example, the store instruction comprises, in a dedicated field, one or more bits indicating the size limit MBB. Alternatively, the size limit could be encoded with the address of the store instruction. For example, the store instruction indicates a virtual address, and if the virtual address falls within a first address range, this implies a first size limit, and if the virtual address falls within a second address range, this implies a second size limit different to the first size limit.

The cache memory or memories 612 of each tile 602, 602' are for example coupled to an external memory (EXTERNAL MEMORY (RAM)) 618, which is for example implemented by random access memory (RAM) such as a DRAM array. Memory accesses to the external memory 618 and to the cache 612 are for example relatively slow with respect to accesses to the scratchpad 606, which for example takes up to 10 clock cycles. For example, memory accesses to the cache 612 involve between 20 and 100 clock cycles, and memory accesses to the external memory 618 involve over 100 and up to 1000 cycles.

In operation, the VP FP co-processor 604 is for example a processor capable of performing floating point computations on relatively large data values of variable precision. In some embodiments, the co-processor 604 could be a UNUM processor that operates on values in the UNUM format directly. Alternatively, the co-processor 604 could perform operations on VP FP values in other formats. The load and store circuit 614 is for example configured to convert intermediate results generated by the co-processor 604 into a bounded memory format (BMF) prior to storage in the cache 612 and/or to the external memory 618. For example, this conversion involves reducing, by rounding or truncating, the lengths of at least some of the VP values stored in one or more of the registers of the scratchpad 604 to a number of bits indicated by the maximum budget MBB stored in the register 616. If the value to be converted is an interval, it is for example reduced by rounding, according to the maximum byte budget MBB, in such a way that the reduced interval contains the input value to be converted.

Figure 7:
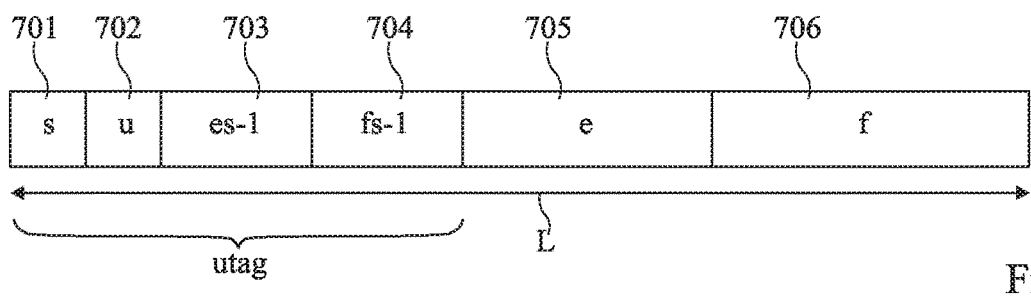
FIG. 7 represents an example of a variable precision floating point number format providing a bounded memory format according to an example embodiment of the present disclosure.

FIG. 7 represents a variable precision floating point number format having the bounded memory format (BMF) according to an example embodiment of the present disclosure. For example, the length L of each value represented in this format does not exceed the limit defined by the MBB value.

The BMF format for example contains the same fields as those of the UNUM format represented in FIG. 2. However, the fields are for example reordered in order to have the descriptor fields (utag, see below) at or close to the beginning of the VP FP value when accessed in a memory. For example, in FIG. 7, a first field 701 stores the sign s, a second field 702 stores the ubit associated with the number, a third field 703 stores the exponent size es-1, a fourth field 704 stores the fraction or mantissa size fs-1, a fifth field 705 stores the exponent e and a sixth field 706 stores the fraction or mantissa f. The fields s, u, es-1 and fs-1 for example form a utag portion of the bounded memory format. These fields provide parameters for interpreting the exponent and mantissa fields e and f. The bit order can of course be from LSB to MSB or vice versa, in order to allow a little endian or big endian memory organization. Additionally or alternatively, the order of the fields could be changed, for example inversed, in order to allow little endian or big endian memory organization.

FIG. 7 corresponds to one example of a bounded memory format for VP FP representation, but it will be apparent to those skilled in the art that variations would be possible. For example, certain fields such as the ubit could be omitted, and different orders would be possible. More generally, the bounded memory format for example comprises at least the fields 705 and 706 containing the exponent and mantissa, and at least one size field indicating, directly or indirectly, the size of the exponent and/or mantissa. For example, the at least one size field indicates an absolute or relative bit length of the exponent field and/or mantissa field. For example, in the case of a relative bit length, the at least one size field could indicate a bit ratio between the exponent field and the mantissa field, or a bit ratio between either or both of the exponent and mantissa fields and the overall bit length of the VP FP value, etc.

As mentioned above, the at least one size field may for example represent either the length of the exponent field, the length of the mantissa field, a bit ratio between the exponent and mantissa fields, or a combined length of the exponent and mantissa fields or of the whole FP number. The at least one size field is for example positioned before the exponent and mantissa fields such that, during a read operation, the size information can be used to determine the number of memory sub-portions or addresses that should be read, as will now be explained in more detail with reference to FIG. 8. Indeed, in some embodiments, the words read from the external memory 618 or from the cache 612 can be of variable length in order to optimize the read operation. Additionally or alternatively, in some embodiments, cache accesses, for example to the L1 cache, include a byte enable interface via which flags can be asserted in order to select the read size based on the bytes that are to be retrieved from the external memory.

Figure 8:
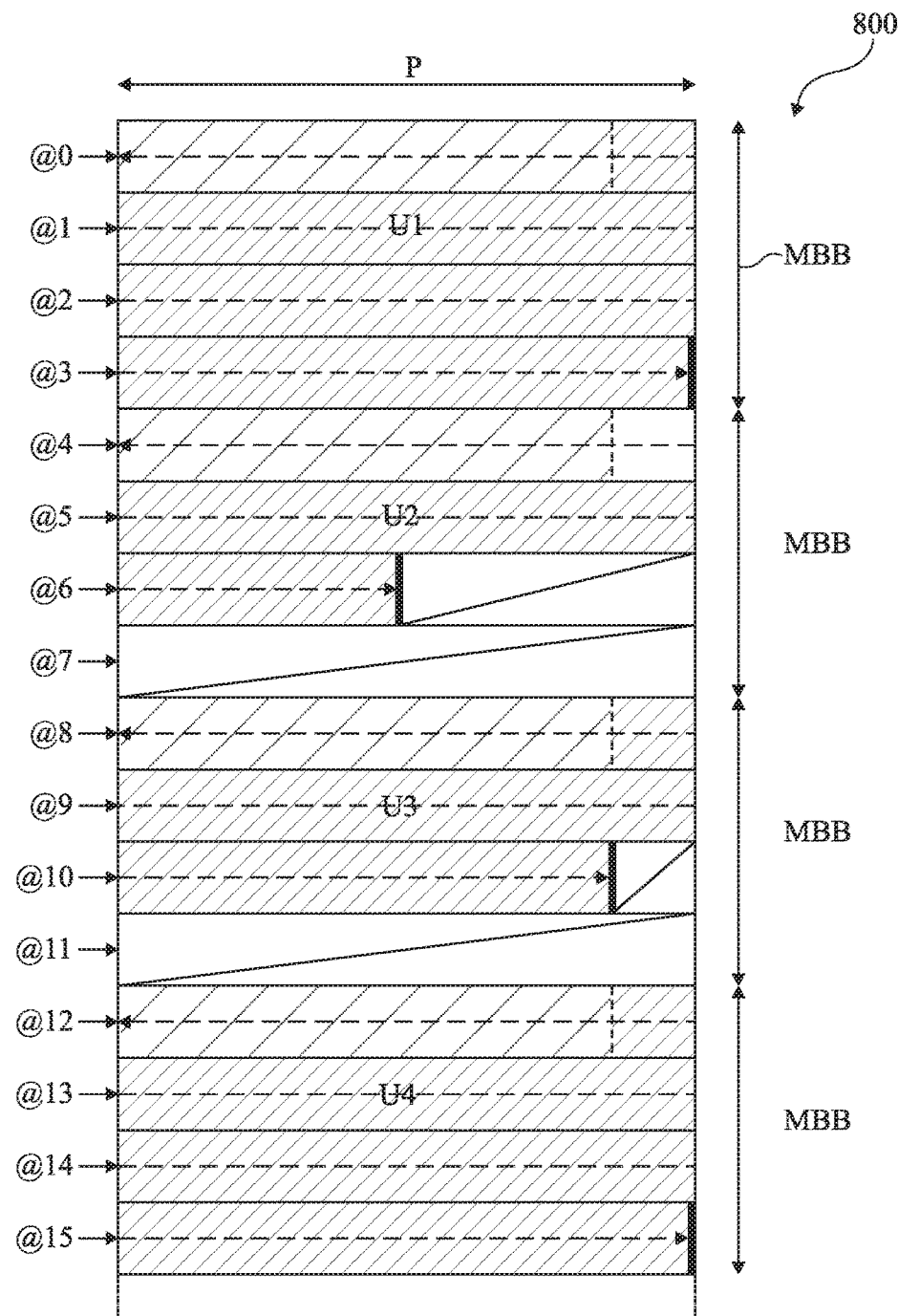
FIG. 8 represents memory addresses of a memory storing floating point numbers wherein each number is in a bounded memory format according to an example embodiment of the present disclosure.

FIG. 8 represents memory addresses of a memory 800 storing floating point numbers wherein each number is in a bounded memory format such as the format of FIG. 7. FIG. 8 illustrates addresses @0 to @15 having address step sizes of length p, where p is for example equal to 8 bits, but could more generally be equal to any positive integer. The value p for example corresponds to the minimum bit length that can be read in a single read operation. Each address corresponds to a sub-portion, of p bits in length, of an address space allocated to each VP FP value. This allocated address space of size equal to at least the size defined by the MBB will be referred to hereafter as a BMF storage zone. In the example of FIG. 8, the maximum byte budget MBB corresponds to 4 bytes, or 32 bits in this example. However, the maximum byte budget could equal any integer number of bytes, or could be replaced by a maximum boundary budget defined as an integer number of the sub-portions p, where p could be any positive integer number of bits.

Indeed, while in the example of FIG. 8 the MBB corresponds to a power of 2, equal to 32 bits in this example, in alternative embodiments the MBB could correspond to a value that is not a power of 2. In such a case, the load and store circuit 614 is for example capable of supporting misaligned memory accesses based on the MBB, in other words memory accesses that access groups of addresses that are not aligned with words of a given power of 2 bit length, such as 32 bits, 64 bits, 128 bits, etc.

The stored bounded memory format values are labelled U1, U2, etc., and each for example comprises a utag containing the fields s, u, es-1 and fs-1 represented by lightly shaded portions, and exponent and mantissa fields represented by densely shaded portions. The length of each UNUM value in the memory is represented by a dashed arrow.

The fields s, u, es-1 and fs-1 are for example present in one or more first sub-portions of each BMF storage zone, in other words the one or memory addresses of the BMF storage zone that will be read first, corresponding for example to the lowest addresses in the example of FIG. 8. In this way the load and store circuit 614 is for example capable of reading this address and determining from the size information the bit length of the VP FP value, and thus of reading only the appropriate number of subsequent addresses in order to read the entire VP FP value. This allows the duration of the read operation to be reduced, which can for example be particularly advantageous in the case that the bit length defined by the MBB, and thus the size of each BMF storage zone, is relatively large, for example equal to 6 bytes or more.

In the example of FIG. 8, the values U2 and U3 are shorter than the maximum byte budget MBB, and thus each comprises one or more empty bits at the end of the corresponding BMF storage zone. Furthermore, the values U2 and U3 occupy less than three bytes, implying that for each of them the fourth byte of the BMF storage zone does not need to be read. The values U1 and U4 for example use the entire length of the maximum byte budget MBB. This implies that each of these values already had a length equal to the MBB, or, more likely, its length was reduced to the MBB during the store operation, assuming that the maximum possible length of the VP FP value was greater than the length defined by the MBB.

The memory storage format represented in FIG. 8 can for example be used in standard load and store modes in which the addresses are accessed one at a time, or in burst modes in which programmed sequences of access operations are performed. For example, during the burst mode, misaligned memory accesses are for example performed. In particular, a number B of p-bit addresses are for example accessed, where B*p is for example equal to the number of bits defined by the MBB, or to a multiple thereof. As such, the number of accessed addresses could be any integer, including odd integers or integers not equal to a power of two. For example, in the case that the MBB corresponds to five p-bit addresses, the burst mode could involve loading or storing five addresses at a time, or a multiple of five addresses.

Figure 9:
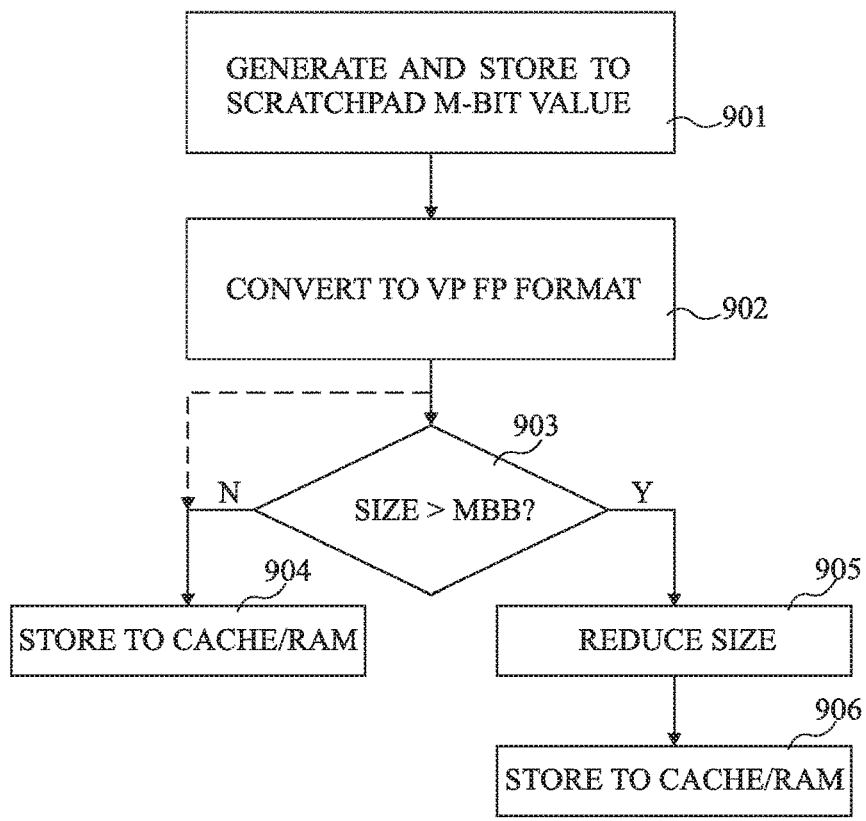
FIG. 9 is a flow diagram illustrating operations in a method of storing a floating point number respecting a bounded memory format to a memory address according to example embodiment of the present disclosure.

FIG. 9 is a flow diagram representing operations in a method of storing a floating point number respecting a bounded memory format to a memory address of a memory according to example embodiment of the present disclosure. This method is for example implemented in part by the VP FP co-processor 604 of FIG. 6 and in part by the load and store circuit 614 of each tile 602, 602' of FIG. 6. Additionally or alternatively, this method could be implemented at least partially by software executed by the VP FP co-processor 604 or by the main processor 603 of FIG. 6.

In an operation 901, an M-bit value is for example generated by the VP FP co-processor 604. This M-bit value for example corresponds to an intermediate result of a computation algorithm executed by the processor 604, such as the value xi(K+1) in the algorithm of FIG. 4. In some cases, the M-bit value is stored to the scratchpad 606, although it could alternatively be generated and then provided directly to the load and store circuit 614, if for example it corresponds to the result of a certain type of operation such as an add and store operation.

In an operation 902, the load and store circuit 614 for example converts the M-bit value from the scratchpad 606 into the VP FP format used by the bounded memory format if this is not already the case. For example, in the embodiment of FIG. 6, the co-processor 604 or main processor 603 may be a UNUM processor configured to process floating point values in the UNUM format, and this conversion involves simply reordering the fields of the UNUM values. In alternative embodiments, other types of processor configured to process variable precision floating point values in other formats could be used, in which case the conversion of operation 902 is for example used to convert the format to that of FIG. 7. In some embodiments, this conversion is performed with no limit to the bit length, and the next operation is an operation 903. Alternatively, this conversion may be performed while directly limiting the bit length to a value equal to or less than the maximum bit length defined by the MBB. For example, in the case that the MBB defines a maximum byte budget, the maximum bit length is equal to 8*MBB. More generally, the maximum bit length is for example equal to p*MBB. In such a case, as represented by a dashed arrow in FIG. 9, the next operation is an operation 904, in which the value is stored directly to the cache or external memory.

In the operation 903, it is determined whether the size of the value in the VP FP format is greater than the maximum bit length defined by the MBB. If not, the value can be stored to cache or external memory in the operation 904. If the size is greater than the maximum bit length, the size is for example reduced in an operation 905, by either rounding the mantissa, or by truncating the mantissa, in other words simply removing a number of least significant bits. For example, if the VP FP value defines an interval, the operation 905 involves reducing the precision of the endpoints, leading to enlarging the interval definition. If the VP FP value defines a scalar value, the output precision is for example reduced to fit within the bit length defined by the MBB, while truncating or rounding, for example, to the nearest value that can be represented using the reduced number of bits. Any of the many possible rounding modes could be used, the many available rounding modes being known to those skilled in the art. In all cases the at least one size field of the VP FP value is also for example modified accordingly in view of the reduced length of the mantissa.

After operation 905, the VP FP value of reduced size is stored to cache or RAM in an operation 906.

Storing the VP FP value to cache or external memory in operations 904 and 906 for example involves storing the at least one size field 703, 704 to one or more first addresses of the BMF storage zone, such that this value can be read first during a subsequent read operation.

In some embodiments, if when reducing the bit length in operation 902 or 905 it is determined that there are not enough bits to represent all of the exponent field, an error message, warning flag, trigger or interrupt could be generated to inform a user that the MBB is insufficient and should be increased.

Figure 10:
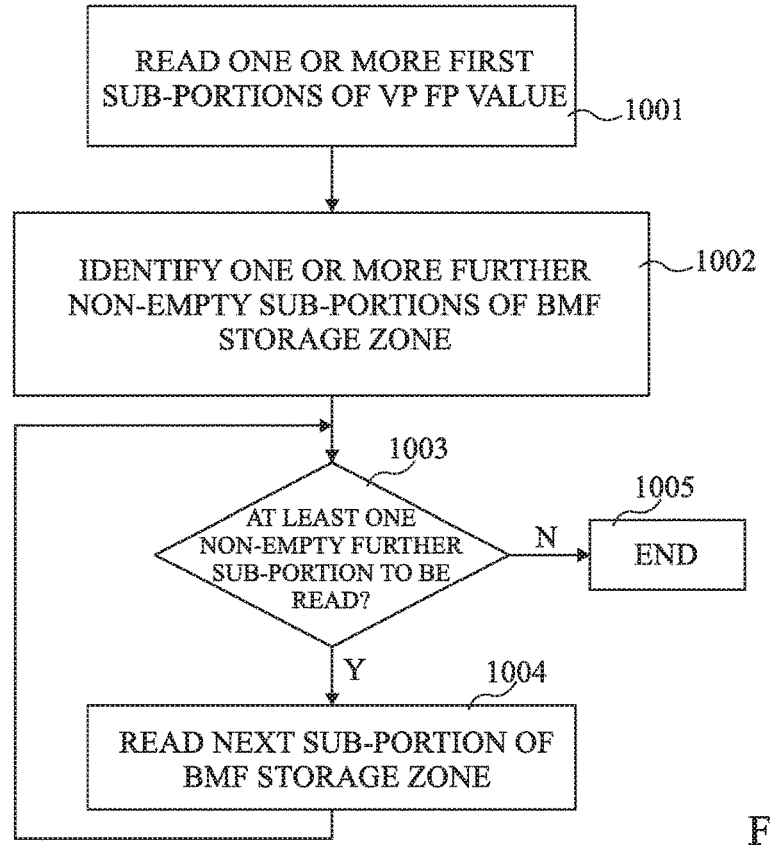
FIG. 10 is a flow diagram illustrating operations in a method of reading a floating point number respecting a bounded memory format from a memory address according to example embodiment of the present disclosure.

FIG. 10 is a flow diagram representing operations in a method of reading a VP FP number respecting a bounded memory format from a memory address of a memory according to example embodiment of the present disclosure. This method is for example implemented by the load and store circuit 614 of each tile 602, 602' of FIG. 6. Alternatively, this method could be implemented at least partially by software executed by the VP FP co-processor 604 or main processor 603 of FIG. 6.

In an operation 1001, a one or more first sub-portions of the VP FP value are read. For example, the first address of the VP FP value can be determined based on the MBB, or it is provided directly in the load instruction, or computed by the main core 603 or by the coprocessor 604. This address, and one or more subsequent sub-portions or addresses storing the at least one size field, are read. In some embodiments, the one or more first sub-portions contain both the exponent size field es-1 and the mantissa size field fs-1, and in some embodiments the whole utag additionally containing the sign bit and the ubit. Of course, it will be apparent to those skilled in the art that multiple sub-portions or addresses may be read in parallel, such as a load 64 bits operation, involving loading 8 bytes corresponding for example to 8 sub-portions.

In an operation 1002, the presence of one or more further non-empty sub-portions of the VP FP value is identified based on the data read from the one or more first sub-portions. For example, this can be determined based at least on the size of the exponent and/or of the mantissa.

In an operation 1003, it is determined whether there is at least one further non-empty sub-portion of the VP FP value to be read. Indeed, in some Cases, it may be determined in operation 1002 that all of the remaining sub-portions of the BMF storage zone are empty, and thus no further read operation is to be performed.

If there is at least one non-empty sub-portion to be read, a next sub-portion of the VP FP value is for example read in an operation 1004, and then operation 1003 is repeated. When there are no further non-empty sub-portions of the BMF storage zone to be read, the method ends at an operation 1005.

Figure 11:
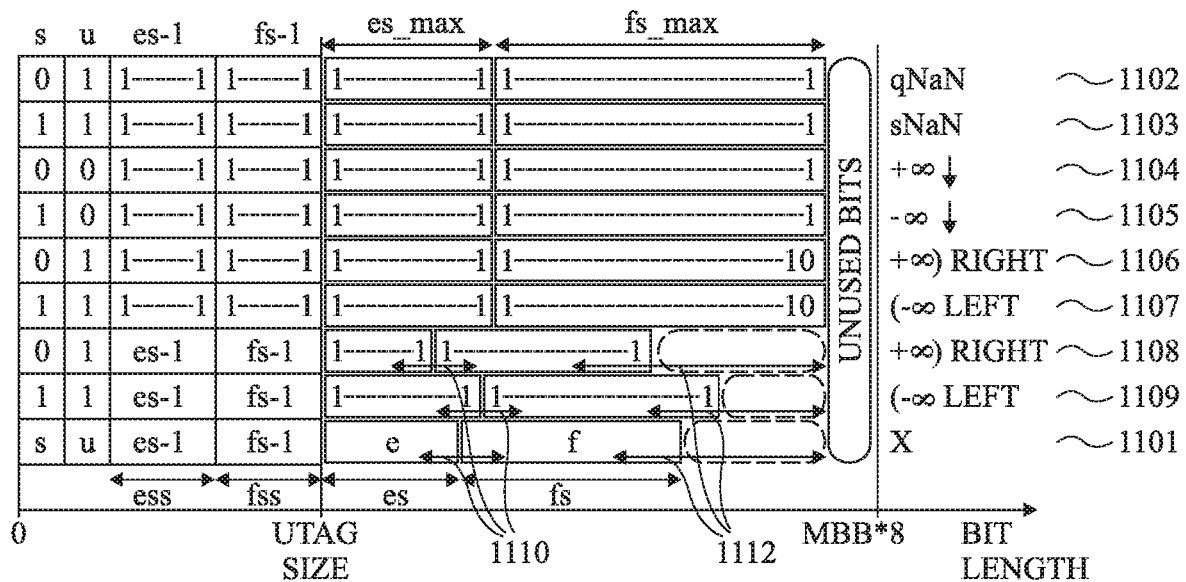
FIG. 11 represents an example of a set of formats for a plurality of FP number types respecting a bounded memory format according to an example embodiment of the present disclosure.

FIG. 11 represents an example of the bounded memory format in the case that the maximum byte budget of the memory is set to a value equal to or greater than the largest VP FP value to be stored to the memory. The horizontal axis in FIG. 11 represents the bit length of the VP FP value stored in memory. As an example, the maximum exponent size es_max could be 16 bits, and the maximum mantissa size fs_max could be 32 bits, and assuming a size ess of 4 bits for the exponent size es-1 field and a size fss of 5 bits for the mantissa size field fs-1, a single sign bit s and a single ubit, the largest VP FP value would be 59 bits. Thus setting the MBB as 64 bits or 8 bytes, all floating point values can be written to a corresponding memory address without reducing their bit length, and even for the largest floating point value size, there will be 5 unused bits (UNUSED BITS). More generally, in the case that the MBB is equal to or higher than the largest floating point number, the largest number of bits that a floating point value according to the bounded number format may have is for example 2+ess+fss+$2^{ess}$+$2^{fss}$.

A bottom row 1101 of FIG. 11 represents a general case in which: the sign bit s is set based on the sign of the floating point value; the ubit is unset if the number is exact, or set if the encoded number is an interval one ULP wide; the exponent and mantissa size fields es-1, fs-1 indicate the sizes of the exponent and mantissa respectively, these fields for example having fixed lengths of ess and fss respectively, the exponent field has a size of between 1 bit and es_max, and the mantissa has a size of between 1 bit and fs_max. For example, the minimum sizes of the exponent and mantissa each being one bit, the exponent size field for example indicates the exponent size minus one (es-1), and the mantissa size field for example indicates the mantissa size minus one (fs-1).

The other rows in FIG. 11 deal with the specific cases of special FP values such as non-numbers that are for example supported by the bounded memory format.

Rows 1102 and 1103 respectively represents values qNaN (quiet Not a Number) and sNaN (signaling Not a Number). The value qNaN is for example a value beyond positive infinity and the value sNaN is for example a value beyond negative infinity, neither of which has any mathematical meaning. The value qNaN is for example encoded by a sign bit of 0, a ubit of 1, and by filling each of the other fields with ones. The value sNaN is encoded in the same way as the value qNaN, but with the sign bit at 1.

Rows 1104 and 1105 respectively represent values of positive infinity and negative infinity. Positive infinity is for example encoded by the sign bit and ubit being set to zero, and the other fields being filled with ones. Negative infinity is for example encoded in the same way as positive infinity, but with the sign bit at 1.

Rows 1106 and 1107 respectively represents values of almost positive infinity and almost negative infinity, corresponding to values that are too big to be represented but which are not at positive or negative infinity. In the case that the represented values are intervals, the word "RIGHT" in row 1106 indicates that the encoded interval does not include positive infinity, and the word "LEFT" in row 1107 indicates that the encoded interval does not include negative infinity. For example, a value of almost positive infinity is encoded by setting the sign to zero, the ubit to 1, and filling the other fields with ones, except the final bit of the mantissa, which is for example at zero. A value of almost negative infinity is for example encoded in the same way as almost positive infinity, but with the sign bit set to one.

Rows 1108 and 1109 represent alternative encodings for almost positive infinity and almost negative infinity, which for example permit a reduction in storage space. Indeed, in rows 1108 and 1109, the sign and ubit fields are for example the same as for rows 1106 and 1107 respectively, but the fields es-1 and fs-1 are for example each set to values lower than the maximum size that can be defined by these fields, in other words they each include at least one bit at zero, and the exponent and mantissa fields are for example set to all ones.

The horizontal arrows 1110 in FIG. 11 (and similarly in FIGS. 12 to 14) indicate that the lengths of the exponent fields of rows 1108, 1109 and 1101 may vary based on the information in the exponent size field es-1. Similarly, the horizontal arrows 1112 in FIG. 11 (and similarly in FIGS. 12 to 14) indicate that the lengths of the mantissa fields of rows 1108, 1109 and 1101 may vary based on the information in the mantissa size field fs-1.

Figure 12:
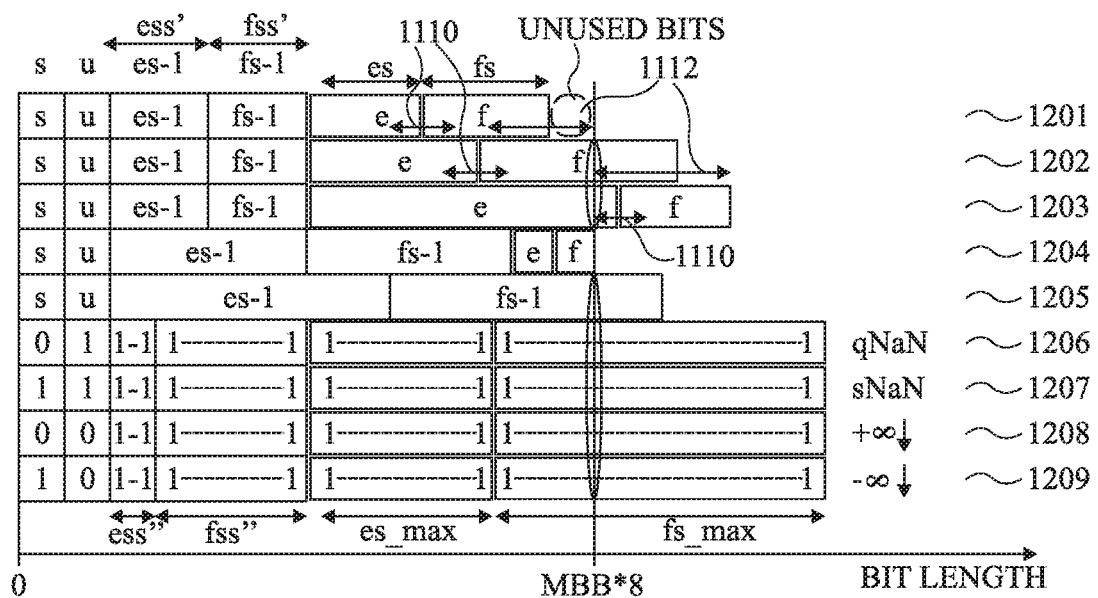
FIG. 12 represents an example of a set of formats for a plurality of FP number types respecting a bounded memory format according to a further example embodiment of the present disclosure.

FIG. 12 represents examples of formats of a plurality of FP number types respecting a bounded memory format according to a further example embodiment of the present disclosure in which the MBB is set to a value lower than the length of at least one of the floating point values to be stored to memory.

A row 1201 in FIG. 12 corresponds to a case in which the VP FP value to be stored has a bit length equal to or lower than the maximum bit length defined by the MBB. In such a case there may be one or more unused bits (UNUSED BITS) in the BMF storage zone.

A row 1202 in FIG. 12 corresponds to a case in which the VP FP value to be stored has a bit length greater than the maximum bit length defined by the MBB, but the combined length of the fields s, u, es-1, fs-1 and e is at least one bit lower than the maximum bit length defined by the MBB. In other words, after being reduced to the MBB, the VP FP value still has a mantissa field of at least one bit. In this case, the VP FP value is reduced from its original bit length to the bit length defined by the MBB by, for example, rounding or truncating the mantissa.

A row 1203 in FIG. 12 corresponds to a case in which the fields s, u, es-1, fs-1 and e of VP FP value to be stored have a combined bit length greater than the maximum bit length defined by the MBB, but the combined length of the fields s, u, es-1 and fs-1 is at least one bit lower than the maximum bit length defined by the MBB. In other words, after being reduced to the MBB, the VP FP value still has an exponent field of at least one bit. In this case, the VP FP value is reduced from its original bit length to the bit length defined by the MBB by reducing its mantissa field to one bit, and truncating the exponent field. Since there are not enough bits to express the exponent, the number value is for example saturated to almost positive or negative infinity, according to the sign of the value.

A row 1204 corresponds to a case in which the sizes ess and fss of the exponent and mantissa size fields es-1, fs-1 of the VP FP value are relatively large, but when rounded or truncated to the MBB, the exponent and mantissa fields still each comprise at least one bit.

A row 1205 in FIG. 12 corresponds to a case in which the sizes ess and fss of the exponent and mantissa size fields es-1, fs-1 of the VP FP value are so large, or the maximum bit length defined by the MBB so small, that the combined bit length of the fields s, u, es-1 and fs-1 is greater than the bit length defined by the MBB. In such a case, the truncated form of the VP FP will be meaningless and will be considered as a coding error.

Rows 1206, 1207, 1208 and 1209 in FIG. 12 correspond to the VP FP values of rows 1102, 1103, 1104 and 1105 of FIG. 11 respectively, but for which the combined length of the fields s, u, es-1, fs-1 and e is at least one bit smaller than the bit length defined by the MBB. These values no longer respect the encoding defined in FIG. 11, and for example result in an error message, or the raising of an error or warning flag, trigger or interrupt, or any other means for reporting an error to a user.

In some embodiments, for example in response to an error message, flag or interrupt, the MBB can be increased in order to avoid at least the cases of rows 1203 and 1205 to 1209 of FIG. 12. However, for the cases of rows 1206 to 1209, the encoding uses the maximum lengths of the fields es-1, fs-1, e and f, and thus these values cannot be truncated at all without creating invalid representations.

An alternative encoding for permitting these values to be encoded using a bit length lower than the maximum length will now be described with reference to FIG. 13. Indeed, in some embodiments described in relation with FIG. 13, it is noted that, when the highest possible bit length of a VP FP value is greater than the bit length defined by the MBB, any such number cannot have both its exponent and mantissa size fields es-1, fs-1 at their maximum values. This permits this maximum value to be used to encode special FP value types.

Figure 13:
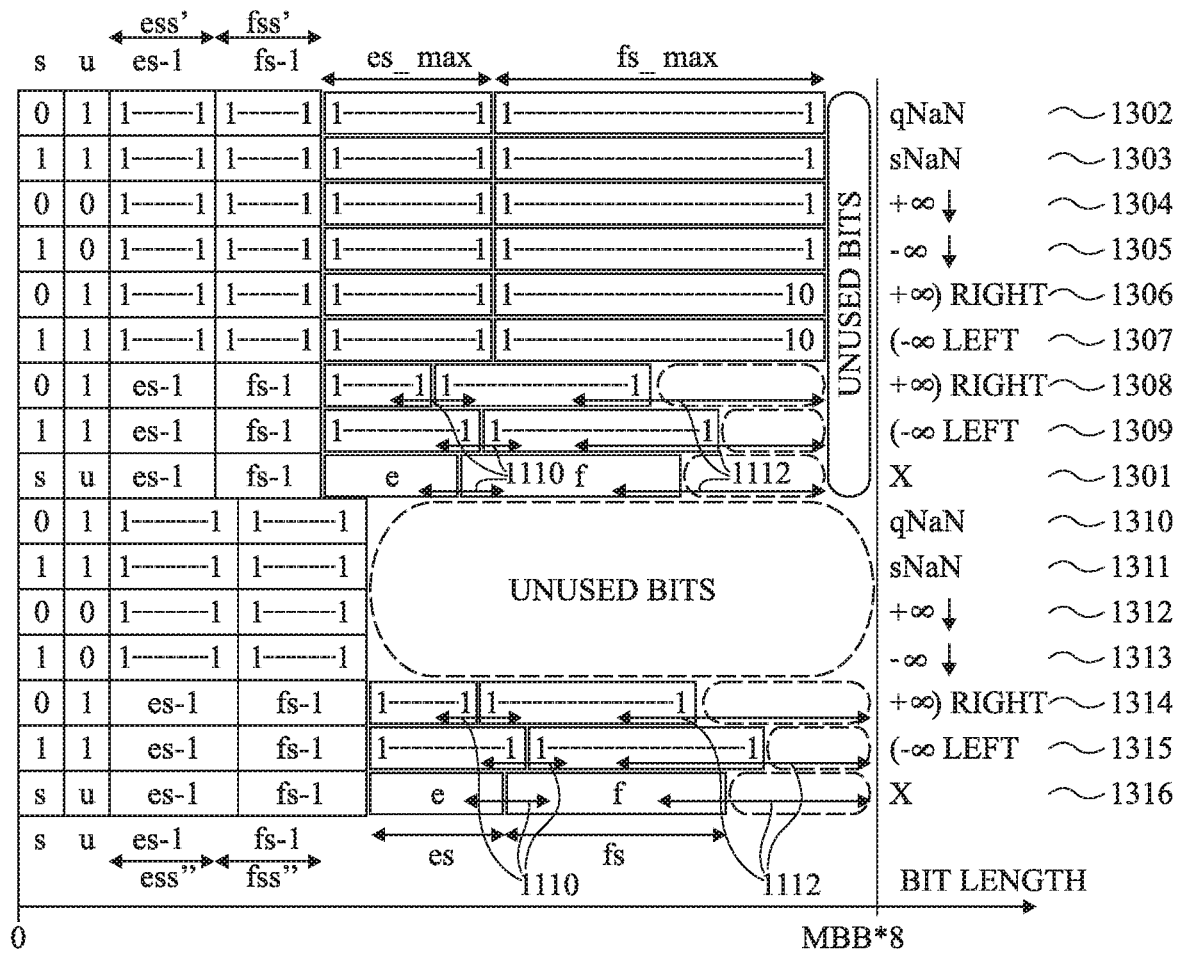
FIG. 13 represents an example of a set of formats for a plurality of FP number types respecting a bounded memory format according to a further example embodiment of the present disclosure.

FIG. 13 represents examples of formats of a plurality of FP number types respecting a bounded memory format according to an example embodiment of the present disclosure.

Rows 1301 to 1309 of FIG. 13 correspond respectively to the cases of rows 1101 to 1109 of FIG. 11, and will not be described again in detail. It is assumed for these cases in FIG. 13 that the fields es-1 and fs-1 have sizes ess' and fss' respectively.

Rows 1310 to 1316 in FIG. 13 correspond to cases in which the fields es-1 and fs-1 have sizes ess" and fss" respectively, which are each larger than the sizes ess' and fss' and the maximum size of a VP FP value to be stored to memory is greater than the maximum number of bits defined by the MBB. However, the MBB is for example chosen such that, after rounding or truncating, the exponent and mantissa fields each comprise at least one bit.

Rows 1310, 1311, 1312 and 1313 encode the same values as the rows 1302, 1303, 1304 and 1305 respectively, using a similar encoding except that the values are for example encoded using only the utag, that is the fields s, u, es-1 and fs-1. In this way, it is not necessary to store or load sub-portions of the BMF storage zone after the utag for these specific VP FP types.

Rows 1314, 1315 and 1316 encode the same values as the rows 1308, 1309 and 1301 respectively, except that in the case of a VP FP value having a bit length greater or equal to the bit length indicated by the MBB, there are for example no unused bits in the memory address. It will be noted that the formats of the numbers in rows 1314 and 1315 differ from those of rows 1302 and 1303 respectively in that, in the case of rows 1314 and 1315, the sizes ess", fss" are such that the highest possible bit length of the VP FP value is higher than the maximum bit length defined by the MBB.

Figure 14:
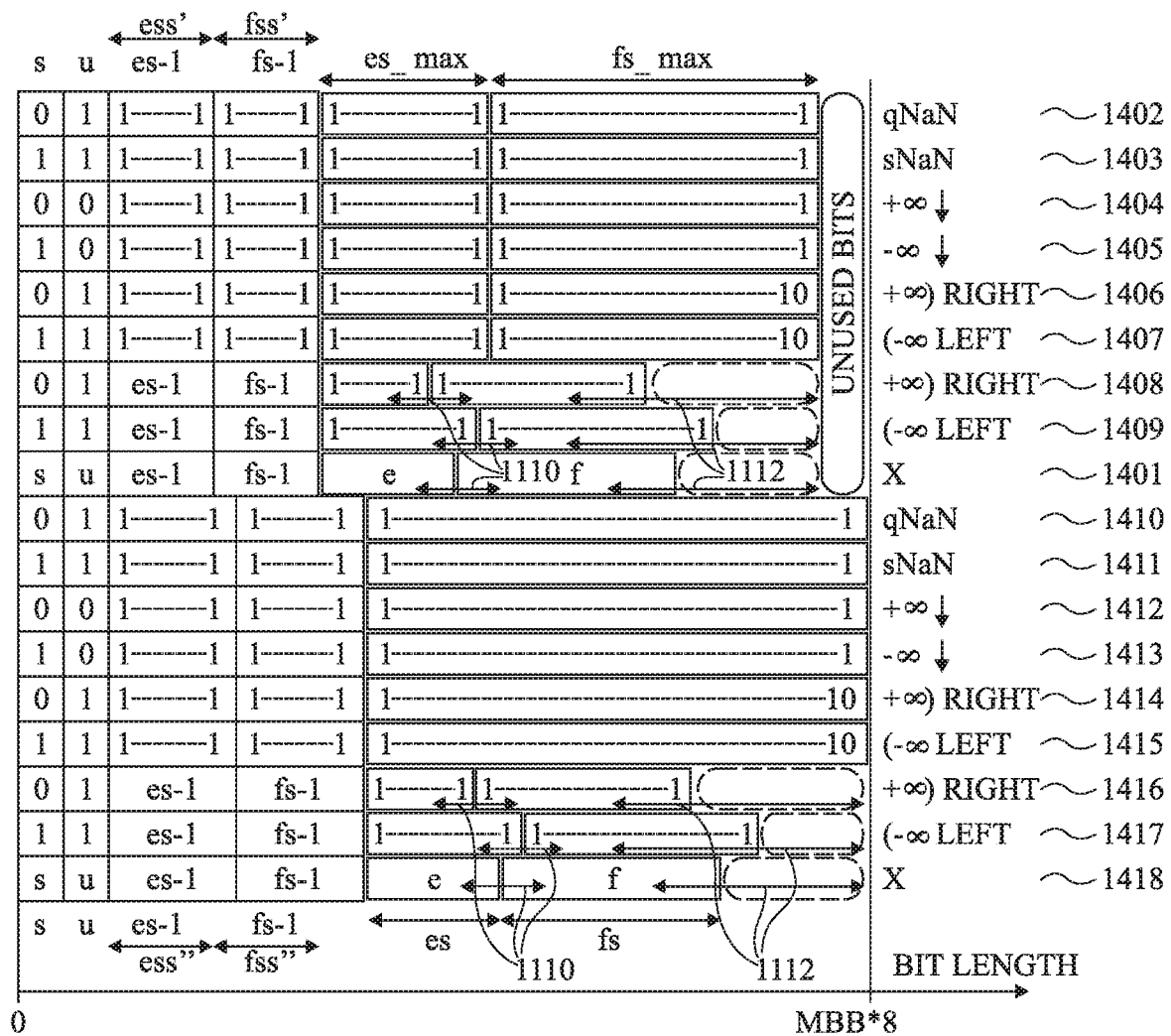
FIG. 14 represents an example of a set of formats for a plurality of FP number types respecting a bounded memory format according to yet a further example embodiment of the present disclosure.

FIG. 14 represents examples of formats of a plurality of FP number types respecting a bounded memory format according to an alternative embodiment to that of FIG. 13.

Rows 1401 to 1409 and 1416 to 1418 are the same as the rows 1301 to 1309 and 1314 to 1316 in FIG. 13, and these rows will not be described again in detail. The four rows 1410 to 1413 encode the same VP FP types as rows 1310 to 1313 of FIG. 13, but rather than having no exponent and mantissa fields, these values are encoded using a single field that is filled with ones. Furthermore, the rows 1414 and 1415 provide alternative manners of encoding the VP FP types of rows 1406 and 1407 using, instead of exponent and mantissa fields, a single field filled with ones, except the final bit, which is a zero.

An advantage of the embodiments described herein is that VP FP values can be stored to a memory in such a way that affine memory accesses are possible, in other words the memory addresses can be accessed for read or write in any order. Furthermore, the precision can be modified dynamically by changing the maximum number bit length defined by the MBB.

Furthermore, relatively fast read operations can be performed by adapting the read operation based on one or more size fields of the VP FP value to be read. In particular, this allows the reading of one or more empty sub-portions of the memory to be avoided.

Various embodiments and variants have been described. Those skilled in the art will understand that certain features of these embodiments can be combined and other variants will readily occur to those skilled in the art. For example, it will be apparent to those skilled in the art that the VP FP formats provided in FIGS. 11 to 14 are merely some examples, and that a set of recognized formats for each VP FP type could comprise any combination of the examples provided in these figures.

Furthermore, it will be apparent to those skilled in the art that in alternative embodiments, the bounded memory format described herein could omit the ubit. Under such a scheme, interval endpoints are for example considered as always being included (exact), and special FP values are for example encoded using dedicated bit encodings.

Furthermore, while examples of reducing the bit lengths of VP FP values have been described based on rounding, it will be apparent to those skilled in the art that there are many specific known rounding techniques that could be applied.

Software Implementation

The memory store operation described above in relation with FIG. 9 based on the format of FIG. 13 can be implemented using the following code, which is in pseudo code:

| Algorithm 2 BMF store |
| --- |

```
1:  function BMFST(U, address, UE, MBB, left_not_right)
2:      utagWidth ← GETUTAGWIDTH(UE)                    ▶ get the utag memory footprint
3:      eWidth ← U.esm1                                 ▶ get the exponent memory footprint
4:      if MAXUSIZE(UE) < MBBSIZE(MBB) then             ▶ UNUM max size can fit in the current MBB
5:          switch [U, left_not_right] do               ▶ check data to be stored
6:              case ISSNAN(U)
7:                  MEM[address] ← sNaN                 ▶ store full length sNaN
8:              case ISQNaN(U)
9:                  MEM[address] ← qNaN                 ▶ store full length qNaN
10:             case ISEXACTINF(U)
11:                 MEM[address] ← |∞ ↓
12:             case ISEXACTINF(U, left_not_right)
13:                 MEM[address] ← ±∞ ...               ▶ store most compact encoding ±∞ ...
14:             case others
15:                 Unorm ← BMF(U, UE, MBB)             ▶ normalize & round U according to MBB
16:                 MEM[address] ← Unorm.utag           ▶ store the BMF-ized utag
17:                 MEM[address+utagWidth] ← Unorm.e    ▶ store the BMF-ized exponent
18:                 MEM[address+utagWidth+eWidth] ← Unorm.f  ▶ store the BMF-ized frac.
19:     else                                            ▶ UNUM max size cannot fit in the current MBB
20:         switch [U, left_not_right] do               ▶ check data to be stored
21:             case ISSNAN(U)
22:                 MEM[address] ← sNaN'                ▶ store compact sNaN
23:             case ISQNAN(U)
24:                 MEM[address] ← qNaN'                ▶ store compact qNaN
25:             case ISEXACTINF(U)
26:                 MEM[address] ← ±∞' ↓
27:             case ISNEXACTINF(U, left_not_right)
28:                 MEM[address] ← ±∞ ...               ▶ store most compact encoding ±∞ ...
29:             case others
30:                 Unorm ← BMF(U, UE, MBB)             ▶ normalize & round U according to MBB
31:                 MEM[address] ← Unorm.utag           ▶ store the BMF-ized utag
32:                 MEM[address+utagWidth] ← Unorm.e    ▶ store the BMF-ized exponent
33:                 MEM[address+utagWidth+eWidth] ← Unorm.f  ▶ store the BMF-ized frac.
```

The memory read operation described above in relation with FIG. 10 based on the format of FIG. 13 can be implemented using the following code, which is in pseudo code:

| Algorithm 1 BMF load |
| --- |

```
1:  function BMFLD(address, UE, MBB, left_not_right)
2:      unum U                                          ▶ loaded UNUM
3:      utag ← LDUTAG(MEM[address], UE)                 ▶ get the utag from the main memory
4:      utagWidth ← UE.ess + UE.fss +2                  ▶ get the utag memory footprint
5:      eWidth ← utag.cs                                ▶ get the exponent memory footprint
6:      fWidth ← utag.fs                                ▶ get the fraction memory footprint
7:      if MAXUSIZE(UE) < MBBSIZE(MBB) then             ▶ UNUM max size can fit in the current MBB
8:          e ← LDEXP(MEM[address+utagWidth], eWidth)   ▶ load the exponent
9:          f ← LDFRAC(MEM[address+utagWidth+eWidth], fWidth)  ▶ load the fraction
10:         switch [utag, e, f, left_not_right] do      ▶ check loaded data
11:             case ISSNAN(utag, e, f)
12:                 U ← sNaN
13:             case ISQNAN(utag, e, f)
14:                 U ← qNaN
15:             case ISEXACTINF(utag, e, f)
16:                 U ← ±∞ ↓
17:             case ISEXACTINF(utag, e, f, left_not_right)
18:                 U ← ±∞ ...
19:             case others
20:                 U ← EXACTFIELDSUNUM(utag, e, f, left_not_right)
21:     else                                            ▶ UNUM max size cannot fit in the current MBB
22:         switch [utag] do                            ▶ check loaded utag
23:             case ISSNAN(utag)
24:                 U ← sNaN
25:             case ISQNAN(utag)
26:                 U ← qNaN
27:             case ISEXACTINF(utag)
28:                 U ← ±∞ ↓
29:             case others
```

-continued

Algorithm 1 BMF load

```
30:         e ← LDEXP(MEM[address+utagWidth], eWidth)           ▶ load the exponent
31:         f ← LDFRAC(MEM[address+utagWidth+eWidth], fWidth)    ▶ load the fraction
32:         switch [utag, e, f, left_not_right] do               ▶ check loaded data
33:            case ISNEXACTINF(utag, e, f, left_not_right)
34:                U ← ±∞ ...
35:            case others
36:                U ← EXACTFIELDSUNUM(utag, e, f, left_not_right)
        return [U]
```

What is claimed is:

1. A method of storing, by a load and store circuit or other processing means, a variable precision floating point value to a memory, the method comprising:
generating the variable precision floating point value using a variable precision floating point processor or co-processor and storing the variable precision floating point value to one or more registers; and
storing the variable precision floating point value from the one or more registers to the memory by:
reducing the bit length of the variable precision floating point value to no more than a size limit; and
storing the variable precision floating point value to one of a plurality of storage zones in the memory, each of the plurality of storage zones comprising one or more memory addresses and each of the plurality of storage zones having a same storage space size equal to or greater than the size limit.

2. The method of claim 1, wherein reducing the bit length of the variable precision floating point value comprises either:
determining, by comparing a bit length of the variable precision floating point value with the size limit, that the bit length of the variable precision floating point value exceeds the size limit, and then rounding or truncating the variable precision floating point value; or
converting the variable precision floating point value from a first format to a second format, wherein in the second format the bit length is limited to no more than the size limit.

3. The method of claim 1, wherein the size limit is stored in a register accessible by the load and store circuit or other processing means, the size limit being programmable.

4. The method of claim 1, further comprising, before reducing the bit length, receiving by the load and store circuit or other processing means a load or store instruction comprising one or more bits indicating the size limit.

5. The method of claim 1, wherein the size limit is equal to a multiple of p bits, where p is a positive integer, the size limit not being equal to a power of 2.

6. The method of claim 2, comprising the step of comparing the bit length of the variable precision floating point value with the size limit, and prior to the comparison, converting the variable precision floating point value from a third variable precision floating point format to the second variable precision floating point format.

7. The method of claim 1, wherein the variable precision floating point value comprises an exponent field, a mantissa field, and at least one size field indicating an absolute or relative bit length of the exponent field and/or mantissa field.

8. The method of claim 7, wherein reducing the bit length of the variable precision floating point value to no more than the size limit comprises modifying the at least one size field in view of the reduced bit length of the variable precision floating point value.

9. The method of claim 7, wherein the at least one size field includes an exponent size field and a mantissa size field.

10. The method of claim 7, wherein, if a bit length of the at least one size field is capable of indicating a bit length of the exponent field and/or of the mantissa field that would exceed the size limit, the step of reducing the bit length comprises setting the at least one size field to a maximum value to encode at least one special FP value type.

11. The method of claim 7, wherein each storage zone comprises a plurality of sub-portions, wherein storing the variable precision floating point value comprises storing the at least one size field of the variable precision floating point value to one or more first sub-portions of the storage zone.

12. A method comprising:
storing one or more variable precision floating point values to a memory address of a memory, by:
reducing the bit length of the variable precision floating point value to no more than a size limit (MBB); and
storing the variable precision floating point value to one of a plurality of storage zones in the memory, each of the plurality of storage zones having a same storage space size equal to or greater than the size limit (MBB), wherein the variable precision floating point value comprises an exponent field, a mantissa field, and at least one size field indicating an absolute or relative bit length of the exponent field and/or mantissa field and wherein each storage zone comprises a plurality of sub-portions, wherein storing the variable precision floating point value comprises storing the at least one size field of the variable precision floating point value to one or more first sub-portions of the storage zone; and
reading, from the memory address in the memory, the variable precision floating point value by:
reading the one or more first sub-portions;
identifying, based on the at least one size field, one or more further non-empty sub-portions of the storage zone; and
reading the one or more further non-empty sub-portions of the storage zone.

13. The method of claim 12, wherein identifying the one or more further non-empty sub-portions further comprises identifying at least one further empty sub-portion of the storage zone, the at least one further empty sub-portion not being read.

14. A method comprising:
generating and storing one or more variable precision floating point values to the memory according to the method of claim 11; and
reading, from a memory address in the memory, the one or more variable precision floating point values comprising:

reading bit values from one or more storage zones of the memory; and extracting from the read bit values one or more variable precision floating point values identified based on the at least one size field of each value.

15. A method of solving a scientific problem using at least one variable precision floating point processor, the method comprising:

generating at least one intermediate result represented by an M-bit variable precision floating point value; and storing the M-bit variable precision floating point value to a memory according to the method of claim 1.

16. A computing system comprising a variable precision floating point (VP FP) processor configured to generate variable precision floating point values, the VP FP processor, and/or a load and store circuit coupled to the VP FP processor, being configured to generate, and store a variable precision floating point value to a memory, by:

generating the variable precision floating point value using a variable precision floating point processor or co-processor and storing the variable precision floating point value to one or more registers; and storing the variable precision floating point value to the memory by:

reducing the bit length of the variable precision floating point value to no more than a size limit; and storing the variable precision floating point value to one of a plurality of storage zones in the memory, each of the plurality of storage zones comprising one or more memory addresses and each of the plurality of storage zones having a same storage space size equal to or greater than the size limit.

17. The computing system of claim 16, wherein the VP FP processor, and/or the load and store circuit coupled to the VP FP processor, is configured to reduce the bit length of the variable precision floating point value by either:

determining, by comparing a bit length of the variable precision floating point value with the size limit, that the bit length of the variable precision floating point value exceeds the size limit, and then rounding or truncating the variable precision floating point value; or converting the variable precision floating point value from a first format to a second format, wherein in the second format the bit length is limited to no more than the size limit.

18. The computing system of claim 16, further comprising a register storing an indication of the size limit, the register being accessible and programmable by the variable precision floating point processor and/or by the load and store circuit.

19. The computing system of claim 16, wherein the VP FP processor, and/or a load and store circuit coupled to the VP FP processor, is configured to store the variable precision floating point value to the memory based on a store instruction, wherein the store instruction comprises one or more bits indicating the size limit.

20. The computing system of claim 16, wherein the VP FP processor is implemented:

as part of a graphics processing unit; or as part of a floating point unit; or as part of a main processing device coupled to a floating point unit.

* * * * *